United States Patent [19]

Berg

[11] Patent Number: 4,658,331
[45] Date of Patent: * Apr. 14, 1987

[54] MOUNTING AN INTEGRATED CIRCUIT CHIP TO AN ETCHED CIRCUIT BOARD

[75] Inventor: William E. Berg, Portland, Oreg.

[73] Assignee: Tektronix, Inc., Beaverton, Oreg.

[*] Notice: The portion of the term of this patent subsequent to Apr. 14, 2004 has been disclaimed.

[21] Appl. No.: 773,757

[22] Filed: Sep. 9, 1985

[51] Int. Cl.$^4$ .......................... H05K 7/20; H05K 1/12
[52] U.S. Cl. .................................... 361/387; 361/386; 361/398; 361/403; 339/17 CF
[58] Field of Search .............. 357/79, 81; 174/52 FP; 339/17 F, 17 CF, 17 LM, 61 M, 176 MP, 112 R; 361/386–388, 398, 400, 401, 403, 413

[56] References Cited

U.S. PATENT DOCUMENTS

| | | | |
|---|---|---|---|
| 4,042,861 | 8/1977 | Yasuda | 361/398 |
| 4,251,852 | 2/1981 | Ecker | 361/398 |
| 4,255,003 | 3/1981 | Berg | 339/61 M |
| 4,517,624 | 5/1985 | Wessely | 361/398 |

Primary Examiner—G. P. Tolin
Attorney, Agent, or Firm—John Smith-Hill

[57] ABSTRACT

An integrated circuit chip is mounted to an etched circuit board using a flexible, sheet-form interconnect member that comprises dielectric material and runs of electrically conductive material each run extending between a contact pad that is exposed at a first main face of the interconnect member and a termination point that is exposed at a second main face of the interconnect member. The interconnect face of the chip and the second main face of the interconnect member are placed in mutually confronting relationship, and the chip is attached to the second main face of the interconnect member by way of its interconnect face, whereby electrically conductive contact is established between the contact pads of the chip and corresponding termination points of the interconnect member. The chip is attached by way of its back face to a thermally conductive plate that has, at one main face, pressure pads that at least partially surround a chip receiving area of the plate. The first main face of the interconnect member and the main face of the circuit board are placed in mutually confronting relationship, with the contact pads of the interconnect member in registration with corresponding contact pads of the circuit board. The plate and the circuit board are clamped together, whereby the pressure pads supply contact force to maintain the contact pads of the interconnect member in electrically conductive pressure contact with the corresponding contact pads of the circuit board.

14 Claims, 5 Drawing Figures

MOUNTING AN INTEGRATED CIRCUIT CHIP TO AN ETCHED CIRCUIT BOARD

This invention relates to a method of mounting an integrated circuit chip to an etched circuit board.

BACKGROUND OF THE INVENTION

It will be appreciated by those skilled in the art that in order to use an integrated circuit chip, it is necessary to make electrical connection to the integrated circuit incorporated within the chip. These connections are made through contact pads located at one main face (hereinafter called the interconnect face) of the chip. Frequently, it is desired to mount the chip on an etched circuit board (ECB) and to establish electrical connection between the contact pads of the chip and circuit runs of the ECB, so as to connect the integrated circuit to other components mounted on the ECB.

As integrated circuits become more complex, in terms of both density of interconnections and number of connections, it is increasingly necessary to pay attention to factors other than the ohmic performance of the connections between the chip and the circuit board. For example, one reason for reducing the size of an integrated circuit is in order to keep path lengths short and avoid degradation of high frequency signals. When the input and output signals of the integrated circuit are low frequency signals, it is not necessary to pay a great deal of attention to the electrical characteristics of the interconnections between the chip and the circuit board, but as signal frequency increases the demands that are placed on the interconnections in order to avoid degradation of the signal become more severe. One electrical connector that is able to transmit high frequency signals without undue degradation is described in U.S. Pat. No. 4,255,003 issued Mar. 10, 1981. In the case of that connector, the chip is mounted on a ceramic substrate that has conductor runs extending from the contact pads of the chip to the periphery of the substrate. The substrate is fitted in a recess in the circuit board, and the conductor runs at the periphery of the substrate align with corresponding conductor runs on the upper surface of the board. A frame-like pressure pad of elastomer, and having conductive fingers on its lower surface, is fitted so that it bridges the gap between the ceramic substrate and the circuit board and the conductive fingers establish connection between the conductive circuit runs of the substrate and the corresponding circuit runs of the circuit board. A frame member is fitted over the pressure pad and is secured to the board, compressing the elastomer so that contact force is provided for maintaining the conductive fingers in contact with the circuit runs. This type of connector has been used successfully with signals at frequencies of up to 10 GHz.

Other problems that present themselves with more complex integrated circuits include problems of heat dissipation and of packaging cost. One method or reducing packaging cost by automation is known as tape automated bonding (TAB). TAB is generally used to establish connections between the contact pads of an integrated circuit chip and conductor runs of a ceramic substrate. See, for example, R. L. Cain, "Beam Tape Carriers-A Design Guide", Solid State Technology, Mar. 1978. Tape automated bonding employs a tape formed from a large number of like interconnect members. Each interconnect member typically comprises a sheet of dielectric material, such as polyimide, and conductor runs that extend over one face of the sheet. The sheet of dielectric material defines a window and the ends of the conductor runs, which are typically of copper, extend as beams into the space defined by the window. Hence, the tape is referred to as beam tape. The window is somewhat larger than the interconnect face of the chip. The tape is fed to a bonding station, at which the interconnect faces of respective chips are presented to the windows of respective interconnect members, and the contact pads of each chip are thermocompression bonded to the beams of the corresponding conductor runs. The tape is severed into individual lengths, corresponding to the respective interconnect members, and the chip is attached to the ceramic substrate. The outer ends of the conductor runs are bonded to the conductor runs of the ceramic substrate.

The many areas in which problems can arise make it necessary to view the packaging of an integrated circuit chip on a system level. It is not sufficient simply to provide the chip with accessible leads. The manner in which the leads will be connected to other elements, and the effect that operation of the circuit will have on other elements, must also be considered.

SUMMARY OF THE INVENTION

In a preferred embodiment of the present invention, an integrated circuit chip is mounted to an etched circuit board using a flexible, sheet-form interconnect member that comprises dielectric material and runs of electrically conductive material supported by the dielectric material in mutually electrically insulated relationship. Each run of the interconnect member extends between a contact pad that is exposed at a first main face of the interconnect member and a termination point that is exposed at a second main face of the interconnect member. The contact pads of the interconnect member correspond in their layout to that of the contact pads of the circuit board, and the termination points correspond in their layout to that of the contact pads of the integrated circuit chip. The interconnect face of the chip and the second main face of the interconnect member are placed in mutually confronting relationship, and the chip is attached to the second main face of the interconnect member by way of its interconnect face, whereby electrically conductive contact is established between the contact pads of the chip and the corresponding termination points of the interconnect member. The chip is attached by way of its back face to a thermally conductive plate that has, at one main face, pressure pads that at least partially surround a chip receiving area of the plate. The first main face of the interconnect member and the main face of the circuit board are placed in mutually confronting relationship, and by bringing corresponding registration targets on the interconnect member and the circuit board into alignment by visual examination the contact pads of the interconnect member are brought into contact with the corresponding contact pads of the circuit board. The plate and the circuit board are clamped together, whereby the pressure pads supply contact force to maintain the contact pads of the interconnect member in electrically conductive pressure contact with the corresponding contact pads of the circuit board.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
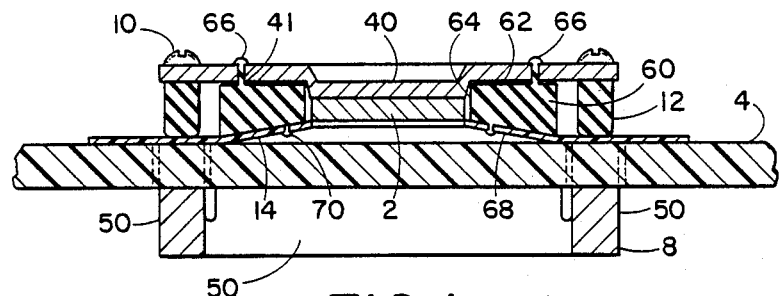
FIG. 1 is a sectional view illustrating an integrated circuit chip mounted to an etched circuit board.

FIG. 1 shows an integrated circuit chip 2 that is attached to an etched circuit board 4 using a plate 6, a backing frame 8 and screws 10 that engage the frame 8 and, on tightening, secure the plate 6 to the board 4, and bring about compression of elastomer pressure pads 12, which provide contact force for maintaining the flex circuit 14 in contact with the circuit board 4.

Figure 2:
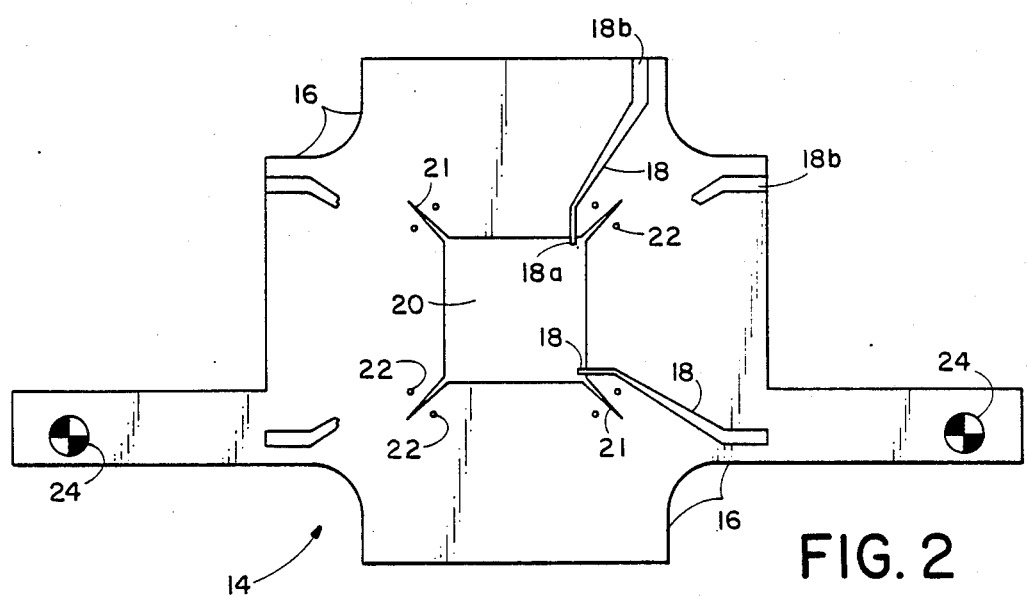
FIG. 2 is a plan view of a flexible circuit.

It will be seen from FIG. 1 that when the IC chip 2 is mounted to the circuit board 4, the flex circuit 14 is not planar but is dished upwardly. In its relaxed state, the flex circuit is planar, and in order to accommodate the dishing shown in FIG. 1 the flex circuit is cut in the outline shown in FIG. 2. As shown in FIG. 2, the flex circuit is somewhat cruciform in outline, and each projecting wing 16 of the circuit can be flexed independently of the other wings. FIG. 2 also shows representative conductor runs 18 of the flex circuit and a window 20 into which the ends 18a of the circuit runs 18 extend as beams. To facilitate subsequent formation of the flex circuit, slits 21 extend outwardly from the corners of the window 20. A pair of holes 22 is formed adjacent the outer end of each slit 21. Two of the wings 16 are formed with alignment targets 24.

Figure 3:
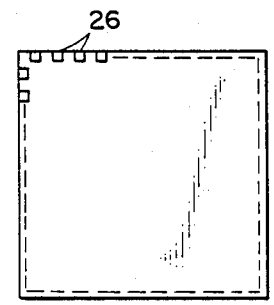
FIG. 3 is a bottom plan view of an integrated circuit chip.

The chip 2 (FIG. 3) has a large number of contact pads 26 distributed about the periphery of its interconnect face.

Figure 4:
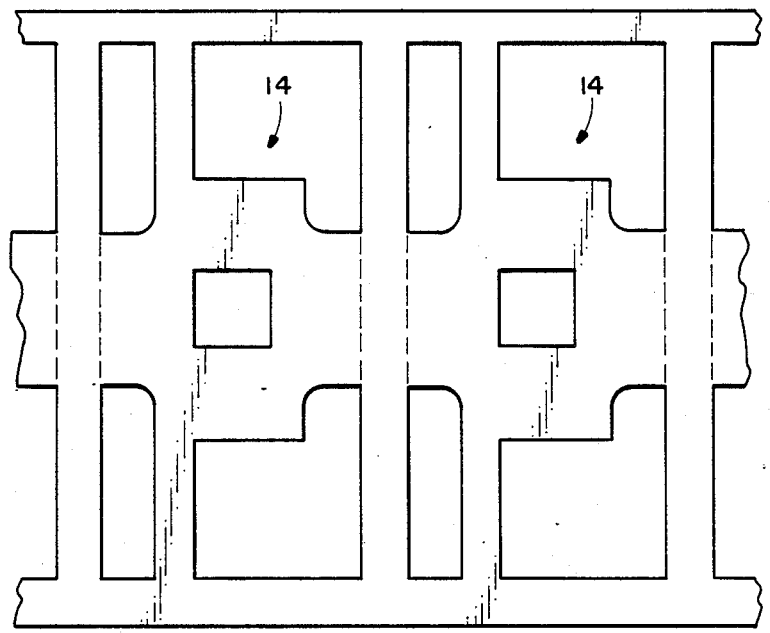
FIG. 4 is a plan view of a tape formed from a plurality of units of the FIG. 2 flexible circuit.
Figure 5:
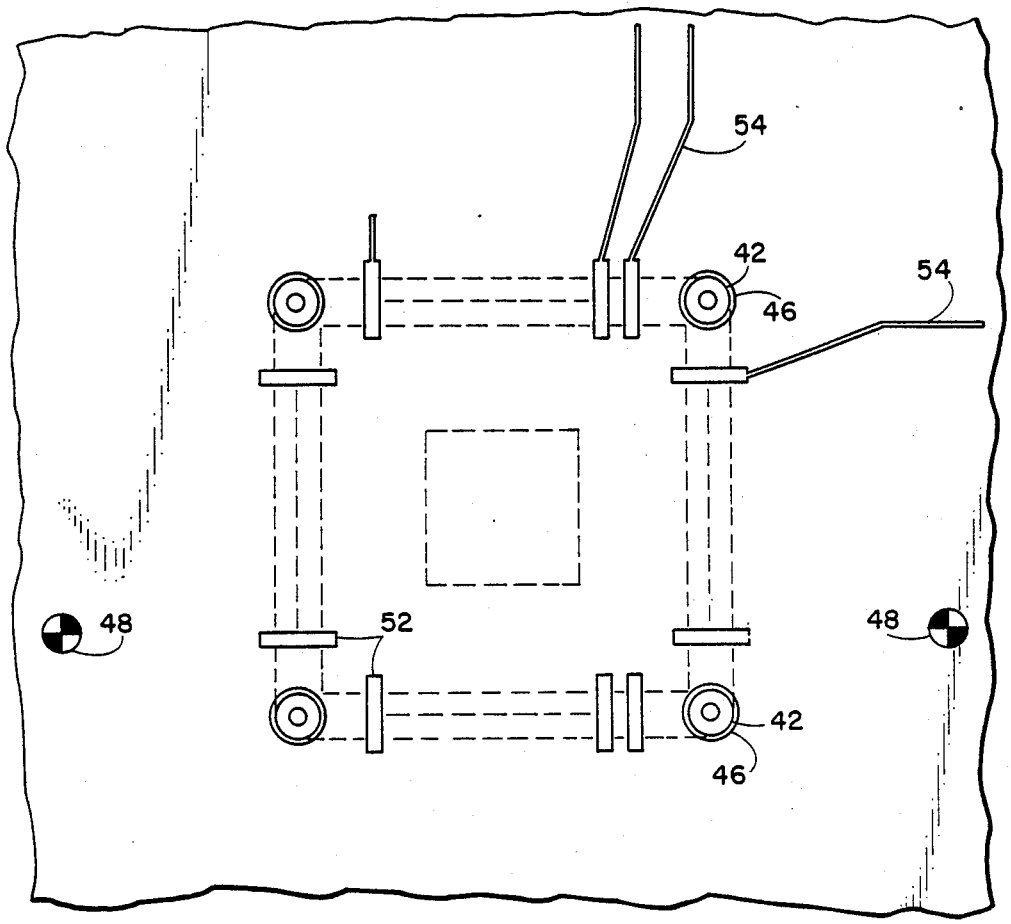
FIG. 5 is a plan view of a portion of an etched circuit board.

As shown in FIG. 4, a large number of units of the flex circuit 14 are formed as a tape. A chip 2 is attached to each circuit 14 by tape automated bonding. In this manner, the contact pads 26 of the chip are secured to the beams of the flex circuit with a high degree of accuracy using conventional machinery. It is conventional to use thermocompression bonding to attach the contact pads of the chip to the beams of the flex circuit. However, in view of the brittleness of the chip and the hardness of the metal of the conductor runs, which is normally copper, it is preferred that the attachment be effected by means of a gold/tin eutectic solder comprising 40 percent gold and 60 percent tin, by weight. In order to achieve this, bumps of gold/tin eutectic alloy are formed on the contact pads 26 of the chip 2, and this alloy melts readily upon application of pressure and heat. Alternatively the contact pads of the chip may be connected to the beams of the flex circuit by wire bonding.

When a chip has been attached to a unit of the flex circuit 14, that unit is detached from the tape, so that a chip/flex circuit sub-assembly results, and a plastic stress-relief device 60 is attached to the flex circuit. The stress-relief device is an injection-molded structure that grips the flex circuit to reduce stresses on the bonds between the chip and the flex circuit during manipulation of the chip/flex circuit sub-assembly. The configuration of the stress-relief device assists in shaping the flex circuit to the desired form.

The stress-relief device 60 comprises a frame that has a flat upper surface 62 bounding an opening 64 and from which posts 66 project, and a lower surface 68 that is bevelled towards the opening 64 and from which posts 70 project. The opening 64 is sized to receive the chip 2, and the posts 70 are positioned to register with the holes 22 in the flex circuit when the chip 2 is fitted in the opening 64. Thus, the stress-relief device 60 is positioned over the chip/flex circuit sub-assembly. The chip is pushed into the opening 64 of the device 60, spreading the slits 22 and causing the planar flex circuit to assume the configuration of the bevelled lower surface 68 of the device 60. The posts 70 are fitted into the holes 22, and the device 60 is heat-staked to the chip/flex circuit sub-assembly.

The plate 6 is generally rectangular in form and is formed at its center with a pedestal 40. Arrayed about the pedestal 40 are holes 41. At the same side of the plate as the pedestal 40, the elastomer pressure pads 12 are attached to the plate by transfer molding. Thus, the pads are molded in situ to the plate. One pad 12 is associated with each of the wings 16. The chip 2 is attached by way of its back face (the face opposite the interconnect face) to the pedestal 40 of the plate 6 using a thermally-conductive epoxy adhesive. The pedestal then extends partially into the opening 64 of the stress-relief device 60, and the posts 66 extend into the holes 41. The device 60 is heat staked to the plate 6. The screws 10 are then fitted in slots (not shown) at the four corners of the plate 6, and the screws are fitted loosely in respective holes of the backing frame 8. The wings 16 then lie over corresponding sets of contact pads 52 at the upper face of the circuit board 4. The contact pads are connected to respective conductor runs 54 of the circuit board. The conductor runs are shown as being exposed at the surface of the board, but it will be appreciated that generally the conductor runs will be covered by dielectric material and will be connected to the contact pads by vias extending through the dielectric material.

The holes in the backing frame are formed in respective posts 42, and the posts extend with clearance into holes 46 formed in the circuit board 4. Therefore, the assembly of the chip 2, the flex circuit 14 and the stress-relief device 60, carried by the plate 6, can be moved somewhat relative to the circuit board 4 so that the targets 24 may be aligned with corresponding targets 48 that are positioned relative to the contact pads or runs of the board. When the alignment targets 24 are properly aligned with the targets 48, the outer ends 18b of the flex circuit runs 18 are in registration with the contact pads 52 of the circuit board, and therefore the screws 10 are then tightened. Ridges 50 along the four sides of the backing frame 8 then engage the back face of the circuit board and are pulled against the circuit board as the pressure pads 12 are compressed. Accordingly, the assembly shown in FIG. 1 is formed.

The interconnection system that has been described with reference to the drawings allows for accurate registration between the outer ends 18b of the flex circuit runs 18 and the contact pads 52 of the circuit board, and therefore reliable interconnection is established between the integrated circuit and the circuit board. By appropriate design of the runs 18 of the flex circuit, these conductor runs may be implemented as transmission lines, i.e. with uniform characteristic impedance, so that good high frequency performance can be obtained. The conductor runs of the flex circuit need not be all of similar width and, for example, wider runs may be used for power supply lines and narrower runs used for signal lines, without increasing the number of operations involved in assembling the interconnection. The density of conductor runs may be readily increased (within the limits of available techniques for manufacturing the flex circuit) or decreased, and the density of conductor runs may vary over a given flex circuit. The plate 6 provides a heat sink that is in close thermally-conductive contact with the chip 2.

The plate 6 is formed with the pedestal in order to increase the space between the general plane of the lower surface of the plate and the interconnect face of the chip. The thickness of the chip is about 20 mil (one mil is 0.001 inch, or about 0.025 mm) and the stress-relief device 60 must have a thickness of no less than about 40 mil, and the pedestal is used to separate the interconnect face of the chip by an additional 20 mil from the general plane of the lower surface of the plate.

The chip is physically attached to the flex circuit 14 by tape automated bonding, instead of using a flex circuit without a window and employing a pressure pad between the flex circuit and the circuit board to maintain pressure contact between the ends 18a of the conductor runs 18 and the contact pads 26 of the chip 4, because TAB is a proven method of making reliable connection to closely spaced, narrow conductors, and interconnection methods using pressure contact usually have associated with them difficulties in establishing alignment of conductor runs. These difficulties do not arise at the connections between the ends 18b and the pads 52, because of the alignment targets 24 and 48 and the mechanically secure method of attaching the chip/flex circuit/plate assembly to the circuit board. It should be noted, however, that it is not essential to use a visual method of establishing alignment and that, for example, a mechanical method using pins mounted on the circuit board and holes in the flex circuit, may also be used.

It will be appreciated that the invention is not restricted to the particular method and apparatus that have been described, and that variations may be made therein without departing from the scope of the invention, as defined in the appended claims, and equivalents thereof.

I claim:

1. A method of mounting an integrated circuit chip that has a plurality of contact pads at its interconnect face to a circuit board that comprises dielectric material, runs of electrically conductive material supported by the dielectric material in mutually electrically insulated relationship, and mutually spaced pads of conductive material connected to said runs and exposed at one main face of the board, said method comprising:
  (a) providing a flexible, sheet-form interconnect member that comprises dielectric material and runs of electrically conductive material supported by the dielectric material in mutually electrically insulated relationship, each run extending between a contact pad that is exposed at one main face of the interconnect member and a termination point that is exposed at the opposite main face of the interconnect member, the contact pads of the interconnect member corresponding in their layout to that of the contact pads of the circuit board and the termination points corresponding in their layout to that of the contact pads of the integrated circuit chip,
  (b) placing the interconnect face of the chip and said opposite main face of the interconnect member in mutually confronting relationship,
  (c) attaching the chip by way of its interconnect face to said opposite main face of the interconnect member, whereby electrically conductive contact is established between the contact pads of the chip and the corresponding termination points of the interconnect member,
  (d) providing a thermally conductive plate that has, at one main face, pressure pad means at least partially surrounding a chip receiving area,
  (e) attaching the chip by way of its back face to the chip receiving area of the plate,
  (f) placing said one main face of the interconnect member and said one main face of the circuit board in mutually confronting relationship, with the contact pads of the interconnect member touching the corresponding contact pads of the circuit board, and
  (g) clamping the plate and the circuit board together, whereby the pressure pad means supply contact force to maintain the contact pads of the interconnect member in electrically conductive pressure contact with the corresponding contact pads of the circuit board.

2. A method according to claim 1, further comprising providing a frame-like stress-relief device defining an opening for receiving the chip and, between steps (c) and (e), inserting the chip into the opening of the stress-relief device and attaching the interconnect member to the stress-relief device.

3. A method according to claim 2, further comprising, between steps (d) and (f), attaching the stress-relief device to the thermally conductive plate.

4. A method according to claim 2, wherein the plate provided in step (d) has a pedestal defining the chip receiving area, and the method comprises inserting the pedestal at least partially into the opening of the stress-relief device.

5. A method according to claim 4, wherein step (f) includes the operation of visually aligning the interconnect member and the circuit board.

6. A method according to claim 1, comprising attaching the chip to the thermally conductive plate by means of adhesive material interposed between the back face of the chip and the chip receiving area of the plate.

7. In combination:
  an integrated circuit chip that has a plurality of contact pads at its interconnect face,
  a circuit board that comprises dielectric material, runs of conductive material supported by the dielectric material in mutually electrically insulated relationship, and mutually spaced pads of conductive material connected to said runs and exposed at one main face of the circuit board,
  a flexible, sheet-form interconnect member that comprises dielectric material and runs of conductive material supported by the dielectric material in mutually electrically insulated relationship, each run extending between a contact area that is exposed at one main face of the interconnect member and a termination point that is exposed at the opposite main face of the interconnect member, the termination points being in electrically conductive contact with respective contact pads of the chip, and the contact areas of the interconnect member corresponding in their layout to that of the contact pads of the circuit board, a thermally conductive plate that has, at one main face, pressure pad means at least partially surrounding a chip receiving area, the chip being attached by way of its back face to the chip receiving area of the thermally conductive plate, and means securing the plate and the circuit board together with said one main face of the interconnect member in confronting relationship with said one main face of the circuit board and the contact areas of the interconnect member in registration with the corresponding contact pads respectively of the circuit board, said pressure pad means being compressed and supplying contact force to maintain the contact pads of the interconnect member in electrically conductive pressure contact with the contact pads of the circuit board.

8. A combination according to claim 6, wherein the contact areas of the interconnect member are exposed at only said one main face of the interconnect member, and the dielectric material of the interconnect member defines an opening that corresponds in its shape to the shape of the interconnect face of the chip and is slightly larger than said interconnect face, said termination points extending as beams into said opening.

9. A combination according to claim 7, further comprising a frame-like stress-relief device defining an opening in which the chip is received, the stress-relief device being attached to the interconnect member.

10. A combination according to claim 9, wherein the stress relief device is attached to the thermally conductive plate.

11. A combination according to claim 9, wherein the thermally conductive plate has a pedestal that defines the chip receiving area, and said pedestal is received at least partially in the opening of the stress-relief device.

12. A combination according to claim 7, wherein the interconnect member and the circuit board carry respective alignment indicia that are in optical registration.

13. A combination according to claim 6, wherein the chip is attached to the thermally conductive plate by means of adhesive material interposed between the back face of the chip and the chip receiving area of the plate.

14. A combination according to claim 13, wherein the adhesive material is an epoxy adhesive material.

* * * * *